United States Patent [19]

McGinn

[11] Patent Number: 5,325,070
[45] Date of Patent: Jun. 28, 1994

[54] STABILIZATION CIRCUIT AND METHOD FOR SECOND ORDER TUNABLE ACTIVE FILTERS

[75] Inventor: Michael McGinn, Scottsdale, Ariz.

[73] Assignee: Motorola, Inc., Schaumburg, Ill.

[21] Appl. No.: 8,103

[22] Filed: Jan. 25, 1993

[51] Int. Cl.⁵ .............................................. H03F 3/45
[52] U.S. Cl. ..................................... 330/256; 330/303
[58] Field of Search ............... 330/256, 257, 288, 289, 330/303; 307/310, 491

[56] References Cited

U.S. PATENT DOCUMENTS

| | | | |
|---|---|---|---|
| 4,339,729 | 7/1982 | Jason | 330/289 |
| 4,498,053 | 2/1985 | Katakura | 330/261 |
| 4,853,647 | 8/1989 | Low | 330/256 |
| 4,926,138 | 5/1990 | Castello | 330/257 |

FOREIGN PATENT DOCUMENTS 0176910  10/1984  Japan ..................... 330/289

*Primary Examiner*—Steven Mottola
*Assistant Examiner*—Tiep Nguyen
*Attorney, Agent, or Firm*—Michael D. Bingham; Bradley J. Botsch, Sr.

[57] ABSTRACT

An active filter circuit (10) that has a cut off frequency being substantially independent of absolute and temperature variations due to on chip resistors ($R_1$, $R_2$ and $R_3$) has been provided. The active filter includes a transconductance gain amplifier (16) having first and second currents ($I_B$ and $I_E$) the ratio of which are controlled such that the absolute and temperature effects of any on chip resistors of the active filter circuit are removed. The ratio of the first and second currents of the transconductance gain amplifier are controlled by a circuit that generates third and fourth currents ($I_b$ and $I_e$) which are a function of a bandgap voltage. The circuit then utilizes the third and fourth currents and provides, to the transconductance gain amplifier, a current that is substantially equal to the ratio of square of the third current to the fourth current, and a current substantially equal to the fourth current.

5 Claims, 2 Drawing Sheets

STABILIZATION CIRCUIT AND METHOD FOR SECOND ORDER TUNABLE ACTIVE FILTERS

FIELD OF THE INVENTION

This invention relates to filters and, in particular, to removing the dependence of second order tunable active filters due to on-chip resistor changes.

BACKGROUND OF THE INVENTION

There exists a frequently used class of second order filter that are widely used because of their simplicity of construction and their ease of biasing. such a second order filter typically includes two storage devices for example, capacitors and inductors, a transconductance gain amplifier and resistors wherein the cut off frequency of the filter is a function of the storage devices, the resistors and the transconductance of the gain amplifier. However, the disadvantage of such a structure is that if the resistors used are on-chip, there will be a larger variation in the cut off frequency due to large absolute changes of the resistors and changes due to temperature variations since the on-chip resistors typically have a large temperature coefficient.

The traditional way of overcoming these problems is to build a reference filter and an accurate oscillator wherein the oscillator drives the filter at the correct frequency and a phase locked loop tunes the center frequency of the reference filter by varying the transconductance of the gain stage. The other filters in the system are then tracked with the reference filter. However, there are several problems with this approach. First, an expensive external component is required. Second, extra pins are required. Third, mismatches can cause errors of up to 3%.

Hence, there exists a need to provide an improved second order filter for removing the effects of on chip resistors thereby substantially reducing absolute changes in the cut off frequency of the filter.

DETAILED DESCRIPTION OF THE EMBODIMENT

Figure 1:
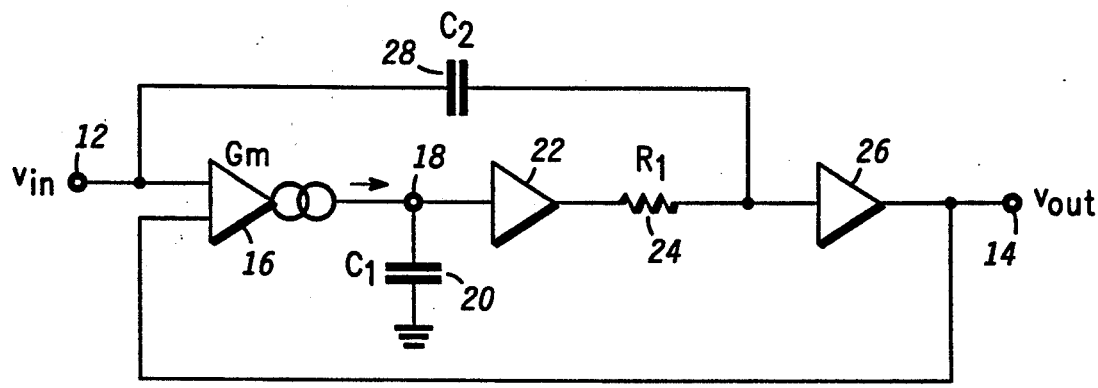
FIG. 1 is a detailed block diagram of a prior art second order active filter.

Referring to FIG. 1, a prior art second order active tunable filter 10 is shown having input terminal 12 for receiving input voltage $v_{IN}$ and output terminal 14 for supplying output voltage $v_{OUT}$. Second order filter 10 includes transconductance gain amplifier 16 having a first input coupled to input terminal 12 and second input coupled to output terminal 14. The output of amplifier 16 provides output current $i_O$ at terminal 18.

Terminal 18 is returned to ground via capacitor 20 wherein capacitor 20 is also denoted by $C_1$. Terminal 18 is also coupled to an input of amplifier 22 the latter having an output which is coupled through resistor 24 to an input of amplifier 26 wherein resistor 24 is also denoted by $R_1$. The output of amplifier 26 is coupled to output terminal 14.

Active filter 10 also includes capacitor 28, denoted by $C_2$, which is coupled between the first input of amplifier 16 and the first input of amplifier 26.

In general, the active filter shown in FIG. 1 is a band trap filter wherein the trap frequency ($w_T$) can be expressed as shown in equation 1.

$$w_T = \frac{1}{(C_1 \times C_2 \times R_1)/g_m} \qquad \text{EQN. 1}$$

where $g_m$ is the transconductance of amplifier 16.

From equation 1, it is clearly seen that the trap frequency is a function of resistor $R_1$ and any resistors that may be included in an expression for $g_m$. Further, if these resistors are on chip resistors, then they typically have large absolute variations and large temperature coefficients which will result in a large variation in $w_T$ due to temperature variations wherein on chip resistors have much larger absolute variations and temperature coefficients than on chip capacitors.

It is worth noting that although FIG. 1 shows an active filter for use as a band reject filter, it is understood that similar configurations may be utilized for creating low pass filters, band pass filters or high pass filters and that the present invention can be utilized with all types of filters.

Figure 2:
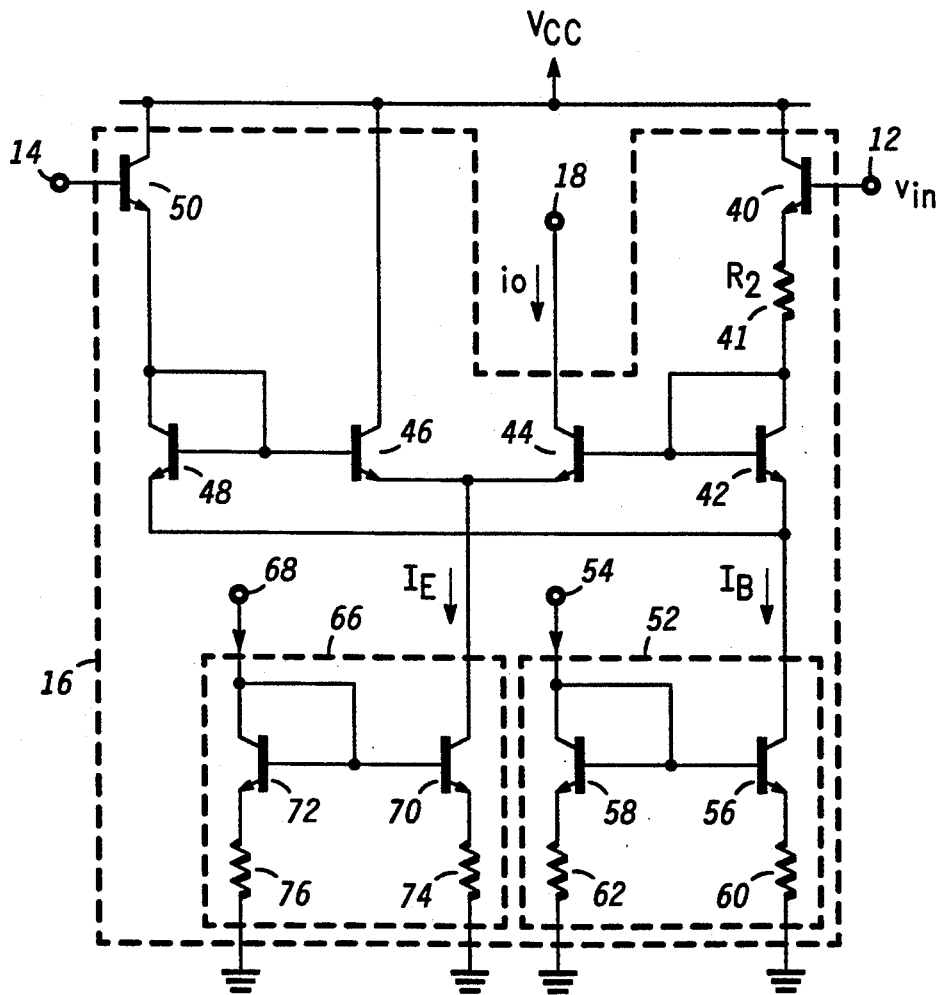
FIG. 2 is a detailed schematic diagram illustrating a transconductance gain amplifier for use in a second order active filter in accordance with the present invention.

Referring to FIG. 2, a detailed schematic diagram of transconductance gain amplifier 16 is shown for substantially reducing the effect of temperature changes of on-chip resistors on the cut off frequency of filter 10. It is understood that components shown in FIG. 2 which are identical to components shown in FIG. 1 are identified by the same reference numbers. Transconductance gain amplifier 16 includes transistors 40 which has a collector coupled to operation potential $V_{CC}$ and a base coupled to terminal 12. The emitter of transistor 40 is coupled through resistor 41 to the base and collector of transistor 42 wherein resistor 41 is also denoted by $R_2$. The collector of transistor 42 is also coupled to the base of transistor 44 the latter having a collector coupled to terminal 18 and for supplying current $i_O$.

The emitter of transistor 44 is coupled to the emitter of transistor 46 the latter having a collector coupled to operating potential $V_{CC}$. The base of transistor 46 is coupled both to the base and collector of transistor 48 the latter having an emitter coupled to the emitter of transistor 42.

The collector of transistor 48 is coupled to the emitter of transistor 50 the latter having a collector coupled to operating potential $V_{CC}$. The base of transistor 50 is coupled to terminal 14 which is essentially the second input of transconductance gain amplifier 16.

The common emitters of transistors 42 and 48 are coupled to an output of current mirror 52. The input of current mirror 52 is coupled to terminal 54 for receiving a current which will be described hereinafter.

Current mirror 52 includes transistor 56 which has a collector coupled to the output of current mirror 52 and a base coupled to the base and collector of transistor 58. The collector of transistor 58 is coupled to the input of current mirror 52. The emitters of transistors 56 and 58 are respectively coupled via resistors 60 and 62 to ground reference.

The common emitters of transistors 44 and 46 are coupled to an output of current mirror 66 while the input of current mirror 66 is coupled to terminal 68 for receiving a current which will be described hereinafter.

Current mirror 66 includes transistor 70 which has a collector coupled to the output of current mirror 66 and a base coupled to the base and collector of transistor 72. The collector of transistor 72 is coupled to the input of current mirror 66. The emitters of transistors 70 and 72 are respectively coupled via resistors 74 and 76 to ground reference.

The transconductance ($g_m$) of gain amplifier 16, which is substantially equal to $i_O/v_{IN}$, can be expressed as shown in equation 2.

$$g_m = (1/R_2)(I_E/I_B) \quad \text{EQN. 2}$$

where
- $I_B$ is the current flowing at the output of current mirror 52; and
- $I_E$ is the current flowing at the output of current mirror 66.

Upon substituting the value for $g_m$ of equation 2 into equation 1, one can obtain the overall expression for $w_T$ of active filter 10 shown in FIG. 1 which utilizes transconductance gain amplifier 16 as shown in FIG. 2.

$$w_T = \frac{1}{[(C_1 \times C_2 \times R_1 \times R_2)(I_B/I_E)]^{\frac{1}{2}}} \quad \text{EQN. 3}$$

Figure 3:
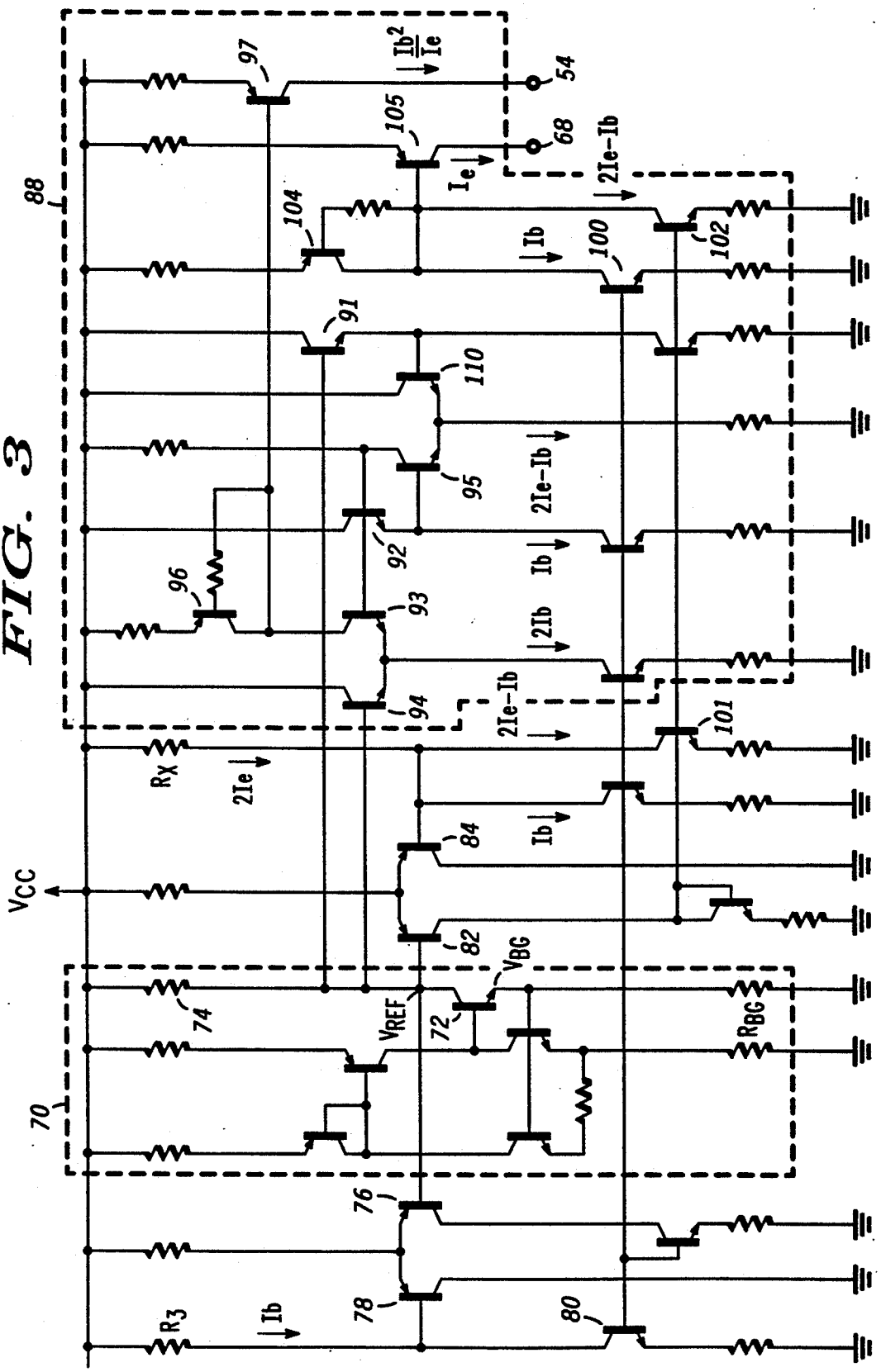
FIG. 3 is detailed schematic diagram of a squaring circuit for generating currents to be supplied to the transconductance gain amplifier of FIG. 2.

The present invention now realizes that the temperature coefficient of $w_T$ as shown in equation 3 is the product of resistors $R_1$ and $R_2$. Further, the present invention realizes that if the ratio of current $I_B$ to current $I_E$ ($I_B/I_E$) is properly chosen, the term ($R_1 \times R_2 \times I_B/I_E$) can be substantially equal to a constant thereby minimizing absolute and temperature variation effects on $w_T$. To accomplish this, the present invention provides current ($I_b^2/I_e$) at the input of current mirror 52 and current $I_e$ at the input of current mirror 66 wherein the circuit that provides these currents is shown in FIG. 3 and described hereinafter. Making use of these current and the current mirror function, currents $I_B$ and $I_E$ of gain stage 16 can be expressed as shown in equations 4 and 5, respectively.

$$I_B = K_1 \times (I_b^2/I_e); \quad \text{EQN. 4}$$

$$I_E = K_2 \times I_e; \quad \text{EQN. 5}$$

where
- $K_1$ and $K_2$ are constants that are set by current mirrors 52 and 66, respectively; and
- $I_b$ and $I_e$ are both functions of a reference voltage.

Now let us define currents $I_b$ and $I_e$ as shown in equations 6 and 7.

$$I_b = V_{REF}/R_3; \quad \text{EQN. 6}$$

$$I_e = V_{REF}/(n \times R_X); \quad \text{EQN. 7}$$

where
- $V_{REF}$ is a reference voltage, for example, a bandgap reference voltage; and
- n is a constant, for example, 2.

One can now obtain the following expression for the term ($R_1 \times R_2 \times I_B/I_E$), a term in equation 3, by utilizing equations 4–7 as shown in equation 8.

$$\begin{aligned} R_1 \times R_2 \times I_B/I_E &= (R_1 \times R_2) \times (K_1/K_2) \times \\ &\quad [V_{REF}/R_3]^2 \times \\ &\quad [(n \times R_X)/V_{REF}]^2 \\ &= K_3 \times (R_X)^2 \end{aligned} \quad \text{EQN. 8}$$

where $K_3 = (K_1/K_2) \times (n^2 \times R_1 \times R_2/R_3^2)$.

If resistors $R_1$, $R_2$ and $R_3$ are on chip resistors of the same type and track each other and resistor $R_X$ is an external, precision, low temperature coefficient resistor, then the term ($R_1 \times R_2 \times I_B/I_E$) is substantially equal to a constant. As a result, the cut off frequency $W_T$ as expressed in equation 3 becomes substantially independent of absolute on chip resistor changes and of temperature changes because the transconductance gain amplifier has been designed to cancel the temperature effects of on-chip resistors by controlling the ratio of $I_E/I_B$.

Thus, it should be understood that by utilizing current mirrors 52 and 66 so as to control the ratio of currents $I_B$ and $I_E$ to be equal to the expressions shown in EQNs. 4 and 5, respectively, the term ($R_1 \times R_2 \times I_B/I_E$) is made to be substantially equal to a constant. Furthermore, by controlling the ratio of currents $I_B$ and $I_E$, the cutoff frequency of filter 10 can be made substantially independent of absolute changes of on chip resistor values and temperature thereby abating any variation effects caused by resistors $R_1$, $R_2$ and $R_3$ on the cutoff frequency. Further, it should also be understood that the cutoff frequency of filter 10 may be varied by varying the value of external resistor $R_X$ while still maintaining a cutoff frequency that is substantially independent of the variation of on chip resistors.

Referring to FIG. 3, a detailed schematic diagram of a circuit used to generate currents Ie and Ib²/Ie which are applied to terminal 68 and 54 respectively of FIG. 2. In essence, the circuit shown in FIG. 3 generates currents Ib and Ie from a temperature-independent, bandgap reference voltage and provides a fraction of the square of current Ib (Ib²/Ie) as well as current Ie at terminals 54 and 68, respectively.

The circuit shown in FIG. 3 includes a standard band gap circuit for generating a band gap voltage at the emitter of transistor 72 as denoted by voltage $V_{BG}$. This band gap voltage then sets up a current through transistor 72 which is substantially equal to voltage $V_{BG}/R_{BG}$. As a result, a reference voltage which is substantially equal to a fraction of the band gap voltage appears at the collector of transistor 72 as denoted by voltage $V_{REF}$. In particular, voltage $V_{REF}$ can be expressed as shown in equation 9.

$$V_{REF} = V_{BG} \times (R_{74}/R_{BG}) \quad \text{EQN. 9}$$

Thus, voltage $V_{REF}$ is substantially equal to a fraction of a band gap voltage and is substantially independent of temperature and power supply.

Because of the operation of a buffer comprised of transistors 76 and 78, the voltage across resistor $R_3$ is also substantially equal to reference voltage $V_{REF}$. Moreover, voltage $V_{REF}$ is converted into reference current Ib wherein current Ib is set to be the current through resistor $R_3$ and transistor 80 and is substantially equal to $V_{REF}/R_3$. It is understood that transistors 76 and 78 and resistor $R_3$ comprise a voltage to current converter for utilizing voltage $V_{REF}$ to generate current Ib.

Likewise, due to the operation of a buffer comprised of transistors 82 and 84, the voltage across external resistor $R_X$ is also equal to reference voltage $V_{REF}$. Moreover, voltage $V_{REF}$ is converted into reference current Ie wherein twice the current Ie (2Ie) is set to be the current through resistor $R_X$ and is substantially equal to voltage $V_{REF}/R_X$. In other words, current Ie is substantially equal to $V_{REF}/(n \times R_X)$ where n=2 thereby remaining consistent with equation 7. It is understood that transistors 82 and 84 and external resistor $R_X$ comprise a voltage to current converter for utilizing voltage $V_{REF}$ to generate current Ie.

The circuit of FIG. 3 now utilizes multiplier/divider block 88 which is essentially responsive to currents $2I_e$ and $I_b$ and provides output currents Ie and $I_b^2/I_e$ at terminals 68 and 54, respectively.

In particular, going around the loop formed by transistors 91-96 of block 88 and assuming that $V_{BE95} = -V_{BE110}$, one can obtain the following nodal equation as shown in equation 10.

$$V_{BE91} - V_{BE92} + V_{BE93} - V_{BE94} = 0 \qquad \text{EQN. 10}$$

By making use of the fact that $V_{BE} = V_T \times \text{Ln}[I_E/I_S]$, where $V_T$ is the thermal voltage, Equation 10 may be written as shown in equation 11.

$$V_T \times \text{Ln}[(2I_e - I_b)/I_{S91}] + V_T \times \text{Ln}(I_{93}/I_{S93}) = V_T \times \text{Ln}(I_b/I_{S92}) + V_T \times \text{Ln}[(2I_b - I_{93})/I_{S93}] \qquad \text{EQN.11}$$

Assuming that saturation currents $(I_{S91}) \times (I_{S93}) = (I_{S92}) \times (I_{S94})$, then we can obtain the following expression for $I_{S93}$.

$$I_{93} = I_b^2/I_{Ie} \qquad \text{EQN.12}$$

Thus, the current through transistor 93 is substantially equal to current $I_b^2/I_e$. Moreover, this current is provided at terminal 54 via the current mirror action of transistors 96 and 97.

Similarly, through the current mirror action of transistors 80 and 100, current Ib is provided through transistor 100. Similarly, through the current mirror action of transistors 101 and 102, current $2I_e - I_b$ is provided through transistor 102. Moreover, through the simple current mirror set up through transistors 104 and 105, current Ie is provided at terminal 68.

By now it should be apparent from the foregoing discussion that a novel active filter circuit that has a cut off frequency being substantially independent of absolute and temperature variations due to on chip resistors has been provided. The active filter includes a transconductance gain amplifier having first and second currents the ratio of which are controlled such that the absolute and temperature effects of any on chip resistors of the active filter circuit are removed.

The ratio of the first and second currents of the transconductance gain amplifier are controlled by a circuit that generates third and fourth currents which are a function of a bandgap voltage. The circuit then provides, to the transconductance gain amplifier, a current that is substantially equal to the ratio of square of the third current to the fourth current, and a current substantially equal to the fourth current.

While the invention has been described in conjunction with specific embodiments thereof, it is evident that many alternations, modifications and variations will be apparent to those skilled in the art in light of the foregoing description. Accordingly, it is intended to embrace all such alternations, modifications and variations in the appended claims.

I claim:

1. An amplifier for use in an active filter having a predetermined cutoff frequency, comprising:
   a first transistor having a collector, a base and an emitter, said collector of said first transistor being coupled to a first supply voltage terminal, said base of said first transistor being coupled to receive an input voltage;
   a second transistor having a collector, a base and an emitter, said collector of said second transistor being coupled to said first supply voltage terminal, said base of said second transistor being coupled to receive a first reference voltage;
   a third transistor having a collector, a base and an emitter, said base of said third transistor being coupled to said collector of said third transistor;
   a fourth transistor having a collector, a base and an emitter, said base and collector of said fourth transistor being coupled to said emitter of said second transistor, said emitter of said fourth transistor being coupled to said emitter of said third transistor;
   a fifth transistor having a collector, a base and an emitter, said collector of said fifth transistor being coupled to an output node of the amplifier to provide an output current, said base of said fifth transistor being coupled to said collector of said third transistor;
   a sixth transistor having a collector, a base and an emitter, said collector of said sixth transistor being coupled to said first supply voltage terminal, said base of said sixth transistor being coupled to said collector of said fourth transistor, said emitter of said sixth transistor being coupled to said emitter of said fifth transistor; a resistor being coupled between said emitter of said first transistor and said collector of said third transistor;
   a first current mirror circuit having an input and an output, said output of said first current mirror circuit being coupled to said emitter of said third transistor to provide a first current;
   a second current mirror circuit having an input and an output, said output of said second current mirror circuit being coupled to said emitter of said fifth transistor to provide a second current; and
   circuit means coupled to said inputs of said first and second current mirror circuits for respectively providing third and fourth currents thereat, said third and fourth currents controlling a ratio of said first and second currents such that the cutoff frequency of the active filter is substantially independent of temperature, said third and fourth currents both being a function of a second reference voltage.

2. The amplifier according to claim 1 wherein said third current is a function of a ratio of a first reference current squared to a second reference current, and said fourth current is a function of said second reference current.

3. The amplifier according to claim 2 wherein said second reference current is a function of an external resistor.

4. The amplifier according to claim 1 wherein said circuit means includes:

a bandgap circuit for providing said second reference voltage, said reference voltage being substantially independent of temperature;

a first voltage to current converter having an input and an output, said input of said first voltage to current converter being coupled to receive said second reference voltage, said output of said first voltage to current converter being coupled to provide a first reference current;

a second voltage to current converter having an input and an output, said input of said second voltage to current converter being coupled to receive said second reference voltage, said output of said second voltage to current converter being coupled to provide a second reference current;

a multiplier and divider circuit for receiving said first and second reference currents and for providing said third and fourth currents at said inputs of said first and second current mirror circuits, said third current being a function of a ratio of said first reference current squared to said second reference current, said fourth current being a function of said second reference current.

5. A method for mitigating temperature variation effects caused by on-chip resistors in second order filters, the second order filter including an amplifier having first and second currents therein, the method comprising the steps of:

generating a reference voltage;

utilizing said reference voltage to generate first and second reference currents;

generating third and fourth currents, said third current being substantially equal to a ratio of said first reference current squared to said second reference current, said fourth current being substantially equal to said second reference current; and utilizing said third and fourth currents to control a ratio of the first and second currents in the amplifier.

* * * * *